United States Patent
Tu

(10) Patent No.: US 7,923,841 B2
(45) Date of Patent: Apr. 12, 2011

(54) METHOD FOR BONDING SEMICONDUCTOR STRUCTURE WITH SUBSTRATE AND HIGH EFFICIENCY PHOTONIC DEVICE MANUFACTURED BY USING THE SAME METHOD

(75) Inventor: Chuan-Cheng Tu, Taipei (TW)

(73) Assignee: RGB Consulting Co., Ltd., Tainan (TW)

( * ) Notice: Subject to any disclaimer, the term of this patent is extended or adjusted under 35 U.S.C. 154(b) by 67 days.

(21) Appl. No.: 12/426,015

(22) Filed: Apr. 17, 2009

(65) Prior Publication Data

US 2009/0261377 A1 Oct. 22, 2009

(30) Foreign Application Priority Data

Apr. 18, 2008 (TW) ................................ 97114263 A

(51) Int. Cl.
*H01L 23/48* (2006.01)
*H01L 21/30* (2006.01)

(52) U.S. Cl. ........... 257/758; 257/E23.023; 257/E21.48; 438/455

(58) Field of Classification Search .................. 257/785, 257/E21.48, E23.023; 438/455
See application file for complete search history.

(56) References Cited

U.S. PATENT DOCUMENTS

| 4,626,322 A * | 12/1986 | Switzer | 205/91 |
| 2010/0019222 A1 * | 1/2010 | Yan et al. | 257/13 |

* cited by examiner

*Primary Examiner* — W. David Coleman
(74) *Attorney, Agent, or Firm* — Muncy, Geissler, Olds & Lowe, PLLC

(57) ABSTRACT

A method for bonding a semiconductor structure with a substrate and a high efficiency photonic device manufactured by using the same method are disclosed. The method comprises steps of: providing a semiconductor structure and a substrate; forming a composite bonding layer on the semiconductor structure; and bonding the substrate with the composite bonding layer on the semiconductor structure to form a composite alloyed bonding layer. The semiconductor structure includes a compound semiconductor substrate and a high efficiency photonic device is produced after the compound semiconductor substrate is removed. Besides, the composite bonding layer can be formed on the substrate or formed on both the semiconductor structure and substrate simultaneously.

32 Claims, 8 Drawing Sheets

METHOD FOR BONDING SEMICONDUCTOR STRUCTURE WITH SUBSTRATE AND HIGH EFFICIENCY PHOTONIC DEVICE MANUFACTURED BY USING THE SAME METHOD

TECHNICAL FIELD

The present invention relates to a method for bonding a semiconductor structure with a substrate and a high efficiency photonic device manufactured by using the same method and, more particularly, to a method for bonding a semiconductor structure with a substrate and a manufactured structure by using the same method where the temperature at which a semiconductor is bonded with a substrate can be reduced effectively by means of providing a composite bonding layer on the semiconductor structure, the substrate, or both on the semiconductor structure and the substrate. Thereby, the present invention is suitably used for photonic devices, especially for the process of manufacturing light-emitting devices, and is able to increase the stability of the manufacturing process and then the yield, to increase the reliability of bonded semiconductor devices and the heat dissipation capability of bonded semiconductor devices, and to decrease the void formation of the bonding layer.

BACKGROUND

Typically, a compound semiconductor is produced by growing epitaxial layers on a substrate to form n-type and p-type semiconductor layers. The epitaxial layers are processed via chemical, lithographical, etching, evaporating, and grinding processes to form compound semiconductor devices, such as light-emitting diodes. However, packaged devices cannot be operated under high electric current since the thermal conductivity of the substrate for growing epitaxial layers thereon is lower. Thereby, it is unable to achieve high output power and the lifetime may be shortened sharply when subject to weather influence.

Moreover, when bonding process is undertaken, the bonding layers on the substrate and on the epitaxial layers can be made by same kind of material or two different kinds of material. When the bonding layers are made by the same kind of material (for example, GaP bonded with GaP), it is advantageous that the thermal cycle stress is minimized since the thermal expansion coefficient of two bonding layers are the same. However, under this condition, the temperature is required to be at least 500° C. When the bonding layers are made by two different kinds of material (for example, Au bonded with In or Au bonded with Sn) by using interface layer, the required temperature is lower (only about 300° C.). However, under this condition, though the required temperature is only about 300° C., the bonded structure may easily be deformed or curved. Consequently, it may result in decreasing the yield, increasing the internal stress of devices, and reducing the reliability of products.

SUMMARY OF THE DISCLOSURE

An object of the present invention is to provide a method for bonding a semiconductor structure with a substrate and a high efficiency photonic device manufactured by using the same method, which are advantageous in increasing the yield, stability, and reliability of products by lowering the bonding temperature and by reducing the chance of oxidation of bonding interface layer by using a composite bonding layer.

In order to achieve above objects, the present invention provides a method for bonding a semiconductor structure with a substrate and a high efficiency photonic device manufactured by using the same method. The method comprises steps of: providing a semiconductor structure and a substrate; forming a composite bonding layer on the semiconductor structure; and bonding the substrate with the composite bonding layer to form a composite alloyed bonding layer. The semiconductor structure includes a compound semiconductor substrate and a high efficiency photonic device is produced after the compound semiconductor substrate is removed. Besides, the composite bonding layer can be formed on the substrate or formed on both the semiconductor structure and substrate simultaneously.

The following detailed description, given by way of examples or embodiments, will best be understood in conjunction with the accompanying drawings.

DETAILED DESCRIPTION

Figure 1:
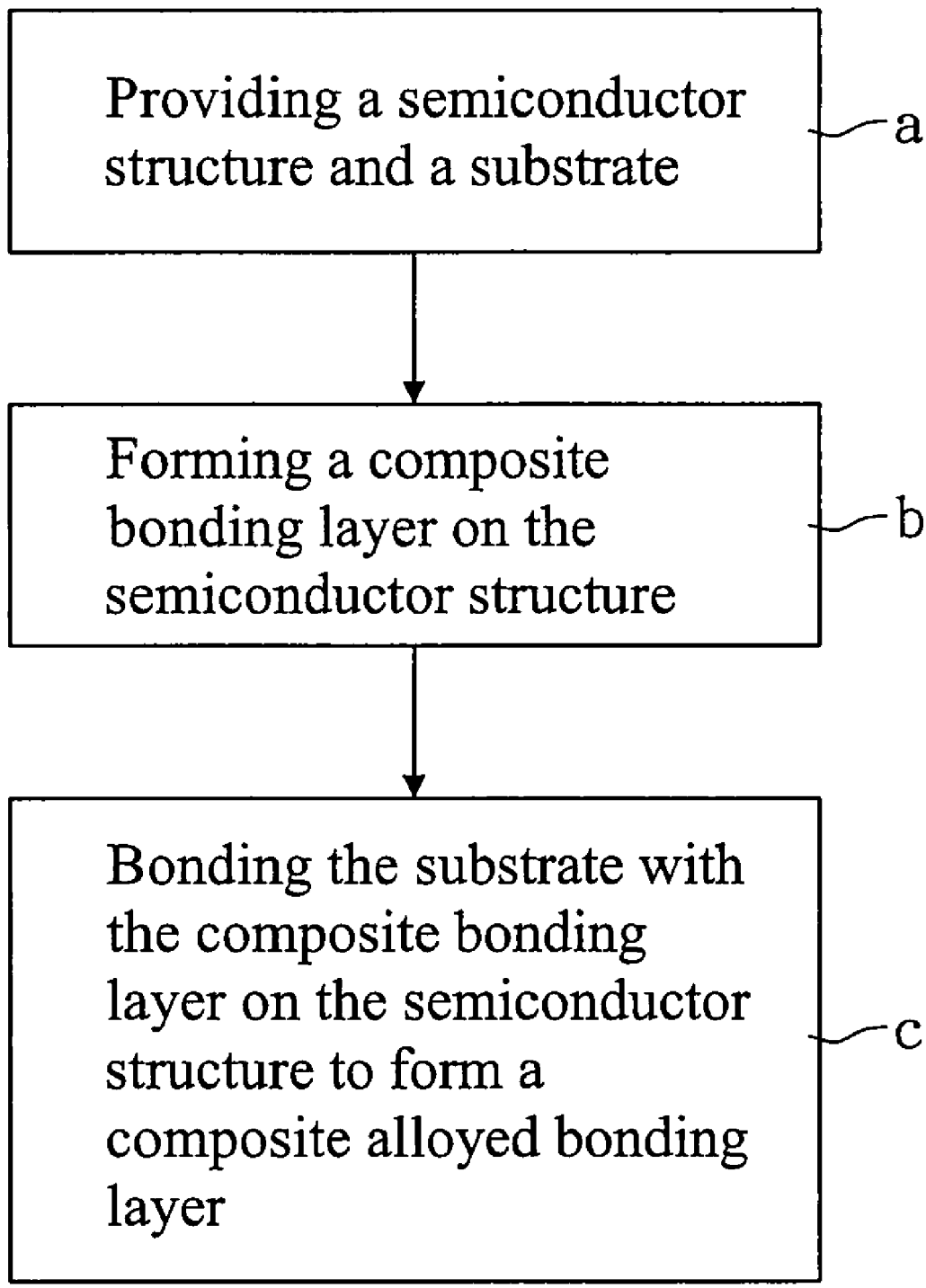
FIG. 1 is a flow chart showing the steps of a method for bonding a semiconductor structure with a substrate of the present invention.
Figure 2:
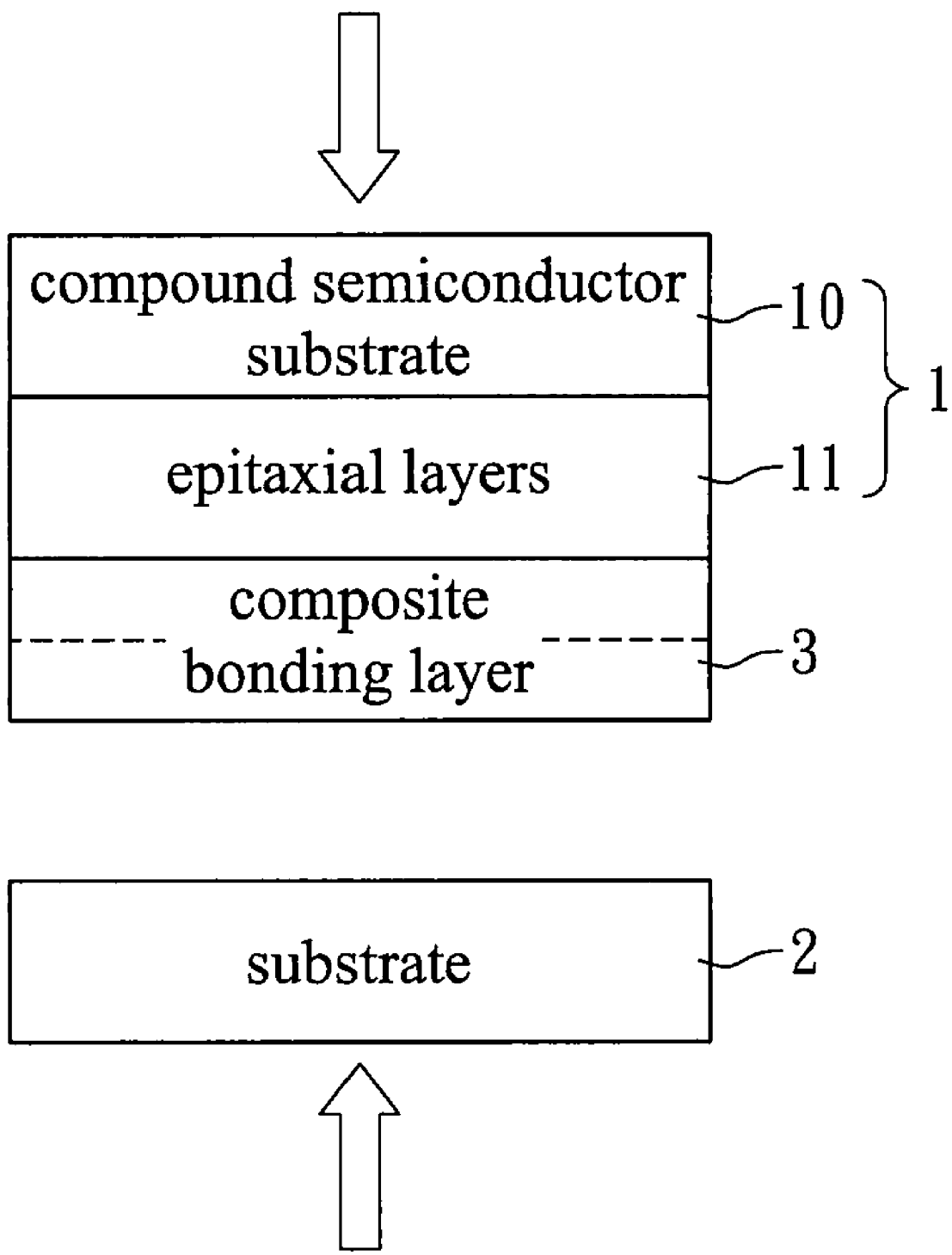
FIG. 2 is a schematic view showing a semiconductor structure and a substrate of the present invention before being pressurized.
Figure 3:
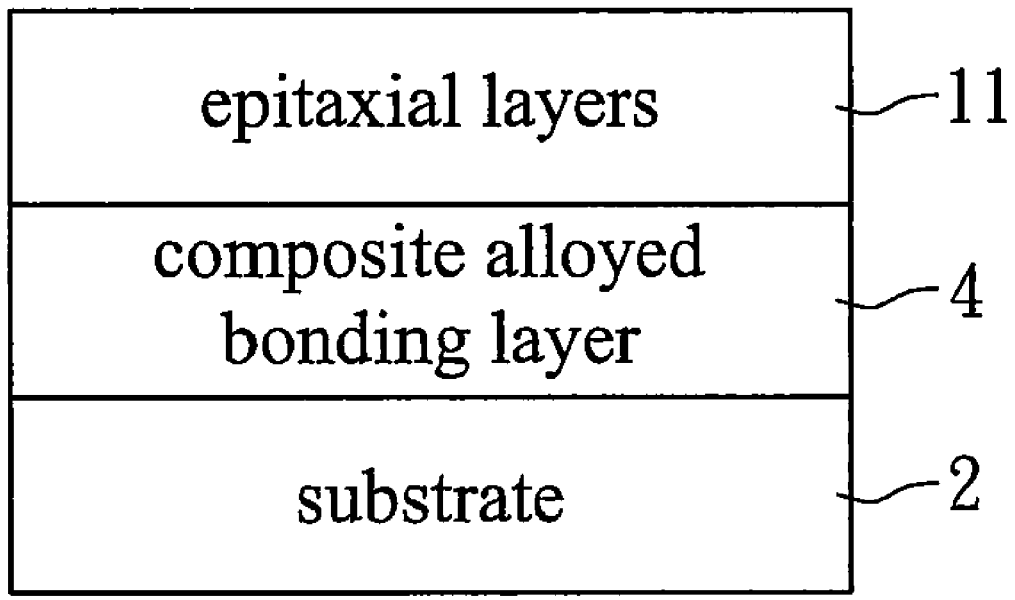
FIG. 3 is a schematic view showing that the semiconductor structure and the substrate are bonded with each other to form a high efficiency photonic device of the present invention.

Please refer to FIGS. 1 to 3 showing an embodiment of a method for bonding a semiconductor structure with a substrate. The method comprises following steps:

a. providing a semiconductor structure 1 and a substrate 2;
b. forming a composite bonding layer on the semiconductor structure 1; and
c. bonding the substrate 2 with the composite bonding layer 3 to form a composite alloyed bonding layer 4.

In this method, the semiconductor structure 1 includes a compound semiconductor substrate 10. The compound semiconductor substrate 10 is provided with epitaxial layers 11 thereon and is made by gallium arsenide, indium phosphide, gallium phosphide, silicon carbide, or sapphire.

The substrate 2 is made by material selected from the group including silicon, aluminum, copper, silicon carbide, diamond, graphite, molybdenum, aluminum nitride, aluminum oxide, zinc oxide, germanium, and copper-tungsten alloy.

The composite bonding layer 3 includes at least two layers and the thickness of outer layer is less than 5000 angstroms. The melting point of the composite bonding layer 3 is between 30° C. to 500° C. and the composite bonding layer 3 is made by material that contains gallium and is selected from the group including indium-gallium, zinc-gallium, tin-gallium, gold-gallium, silver-gallium, platinum-gallium, bismuth-gallium, indium-gallium-tin, indium-gallium-indium, zinc-gallium-zinc, indium-gallium-silver, and indium-gallium-gold. Or, the composite bonding layer 3 is made by material that contains bismuth and is selected from the group including indium-bismuth, bismuth-gallium, indium-bismuth-indium, gold-bismuth-indium, silver-bismuth-indium, and indium-bismuth-tin. Or, the composite bonding layer is made by material that has eutectic property and is selected form the group including indium-bismuth (the eutectic melting point of which is 72° C.), indium-tin (the eutectic melting point of which is 120° C.), indium-bismuth-tin (the eutectic melting point of which is 60° C.), and tin-bismuth (the eutectic melting point of which is 138° C.).

Thereby, in practice, the composite bonding layers 3 made by above material with melting point between 30° C. to 500° C. are piled in sequence on the epitaxial layers 11 of the semiconductor structure 1 under low temperature environment by means of methods such as sputtering or evaporation. After that, the substrate 2 and the composite bonding layer 3 are pressurized at the temperature between 60° C. to 500° C. to form a composite alloyed bonding layer 4. Finally, the compound semiconductor substrate 10 is removed by means of methods (such as etching, grinding, or laser lift-off), so that the epitaxial layers 11 grown on the compound semiconductor substrate 10 can be transferred onto the substrate 2 to form a high efficiency photonic device 5.

Figure 4:
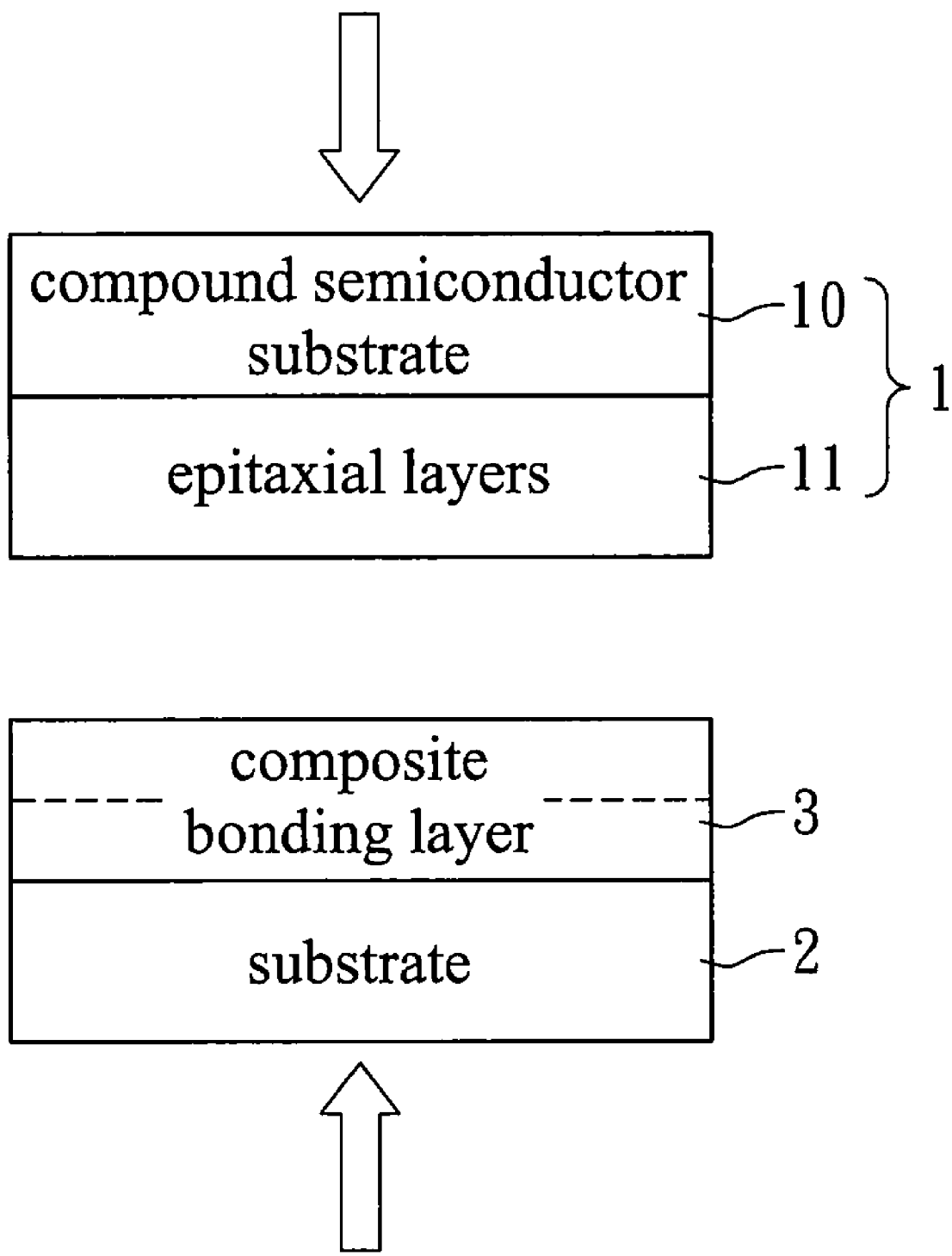
FIG. 4 is a schematic view showing a semiconductor structure and a substrate before being pressurized according to another bonding method of the present invention.
Figure 5:
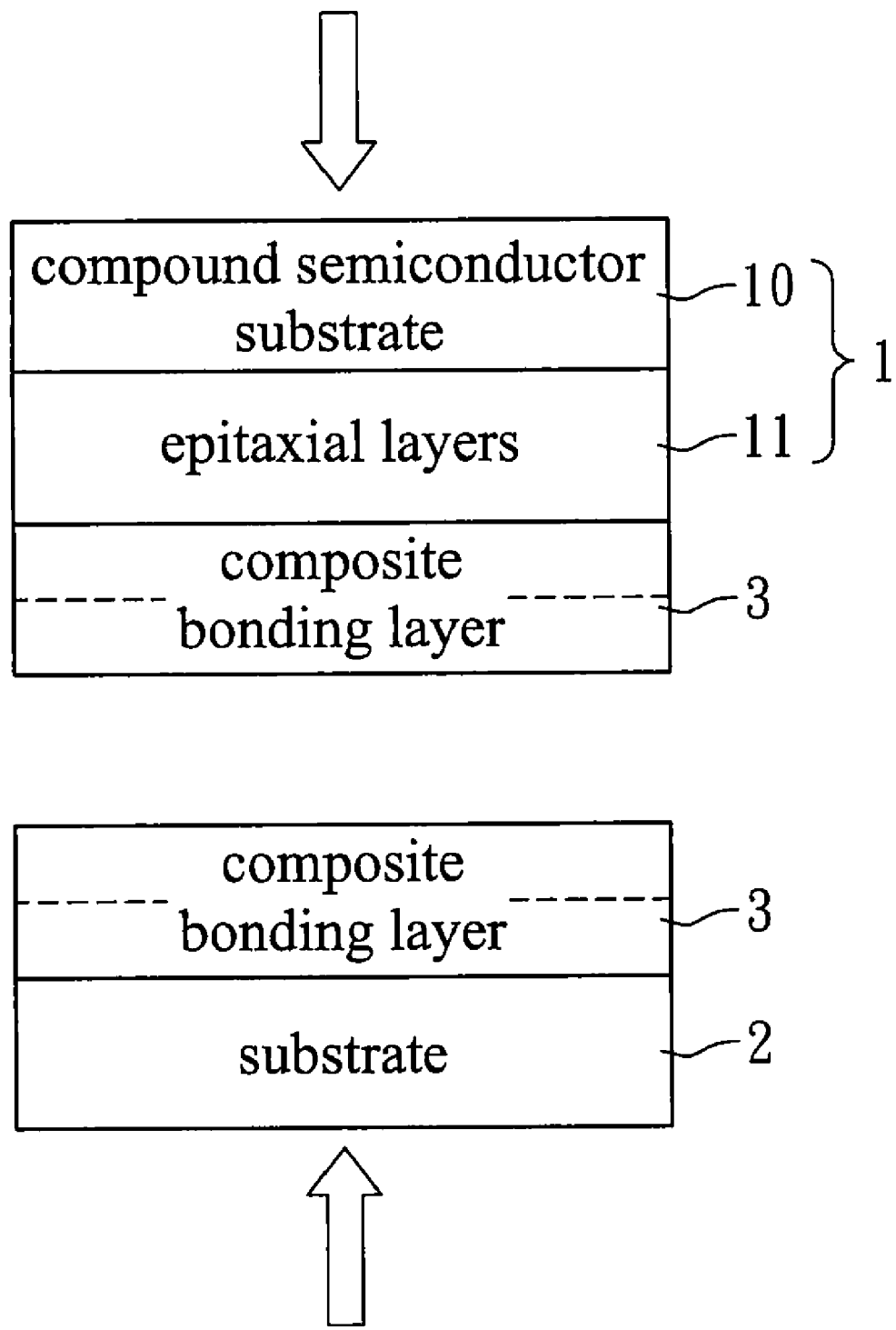
FIG. 5 is a schematic view showing a semiconductor structure and a substrate before being pressurized according to still another bonding method of the present invention.

Besides, as shown in FIGS. 4 and 5, the composite bonding layer 3 of the present invention also can be provided on the substrate 2 and the composite bonding layer 3 can be bonded with the semiconductor structure 1 to form the composite alloyed bonding layer 4. Or, the substrate 2 and the semiconductor structure 1 are respectively provided with one composite bonding layer 3 and above two composite bonding layers 3 can be bonded with each other to form the composite alloyed bonding layer 4. The objects and the effects of the present invention can be achieved in both ways mentioned above.

Figure 6:
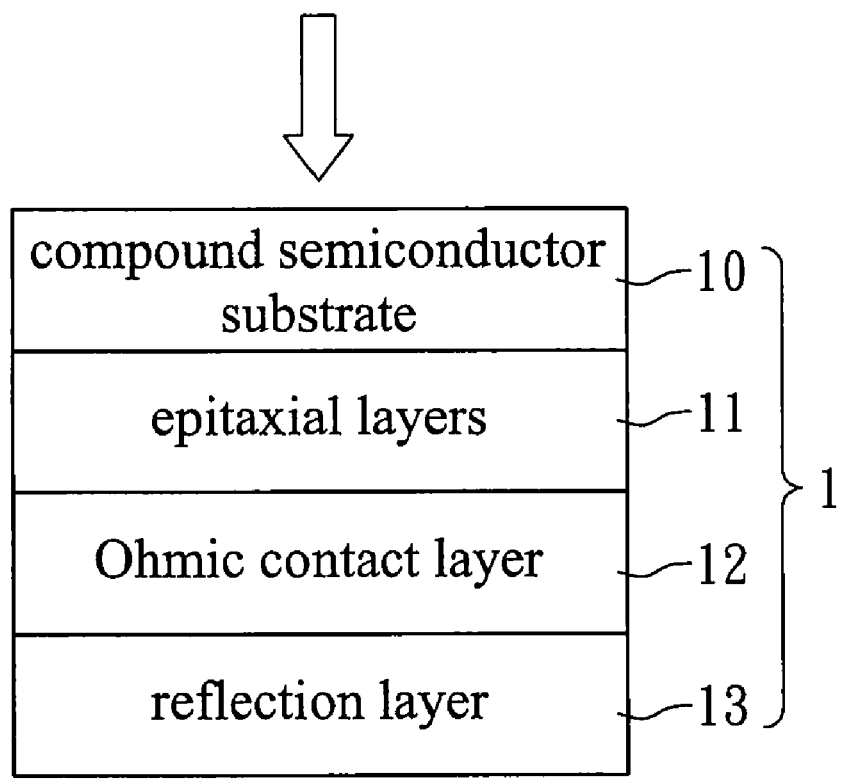
FIG. 6 is a schematic view showing a semiconductor structure provided additionally with an Ohmic contact layer and a reflection layer and a substrate provided additionally with an Ohmic contact layer before being pressurized according to the present invention.
Figure 6:
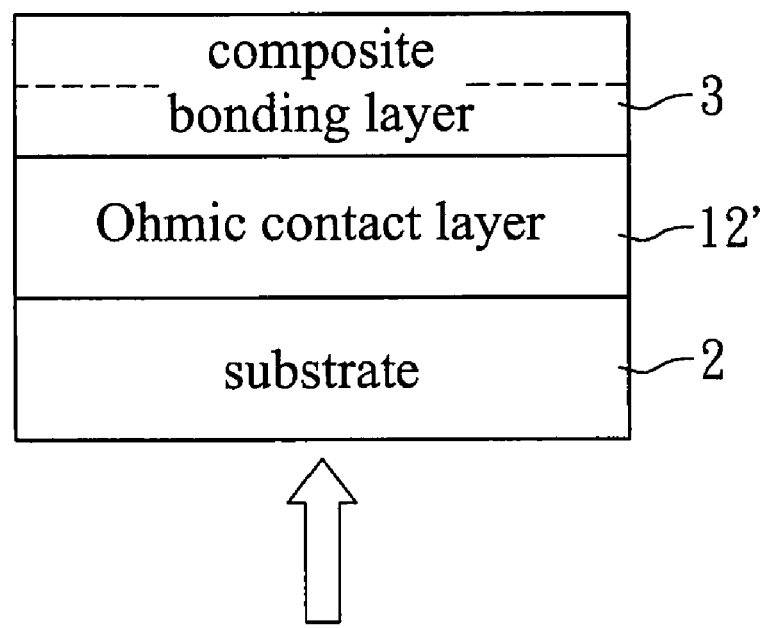
Figure 7:
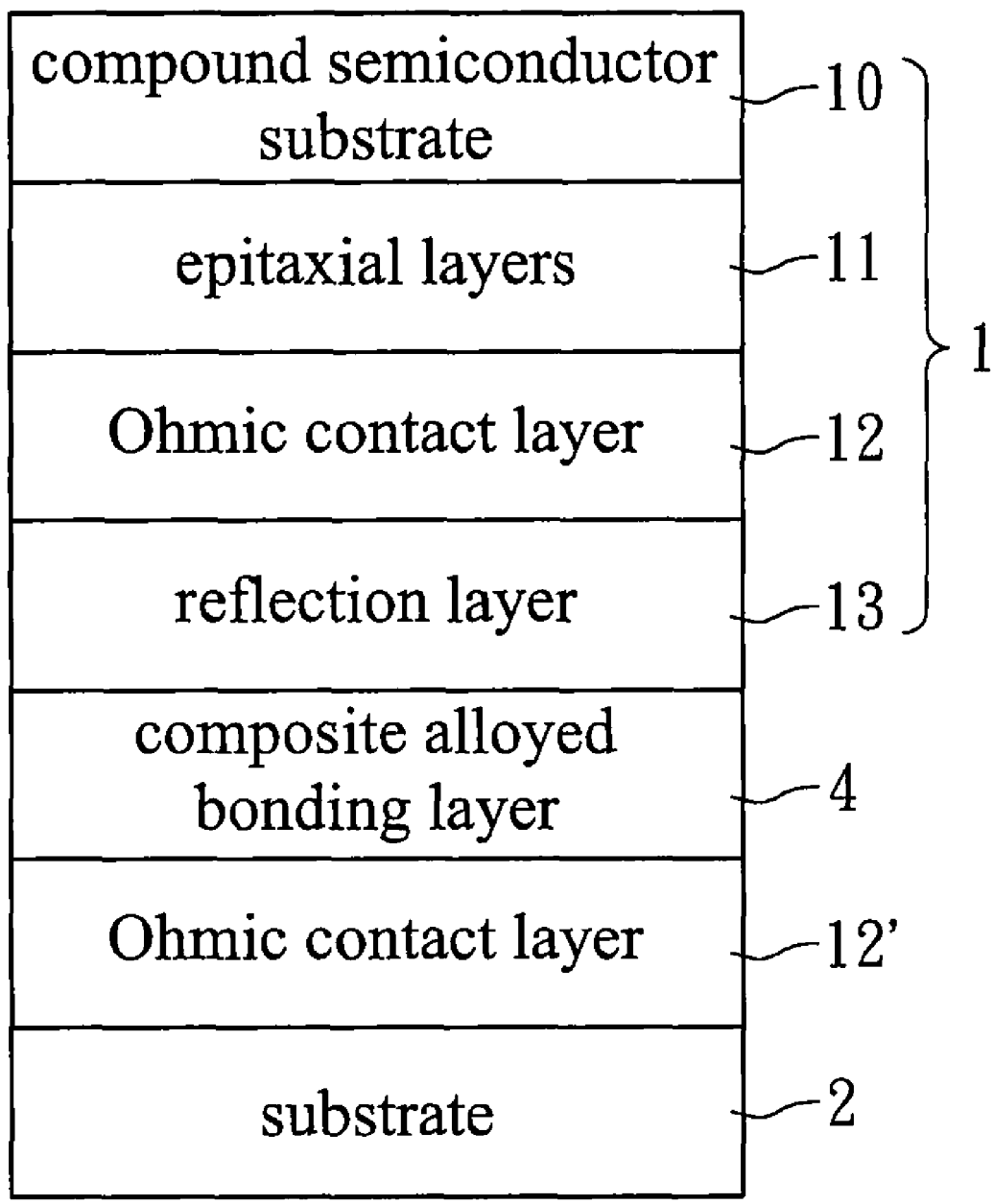
FIG. 7 is a schematic view showing a semiconductor structure provided additionally with an Ohmic contact layer and a reflection layer and a substrate provided additionally with an Ohmic contact layer after being pressurized according to the present invention.
Figure 8:
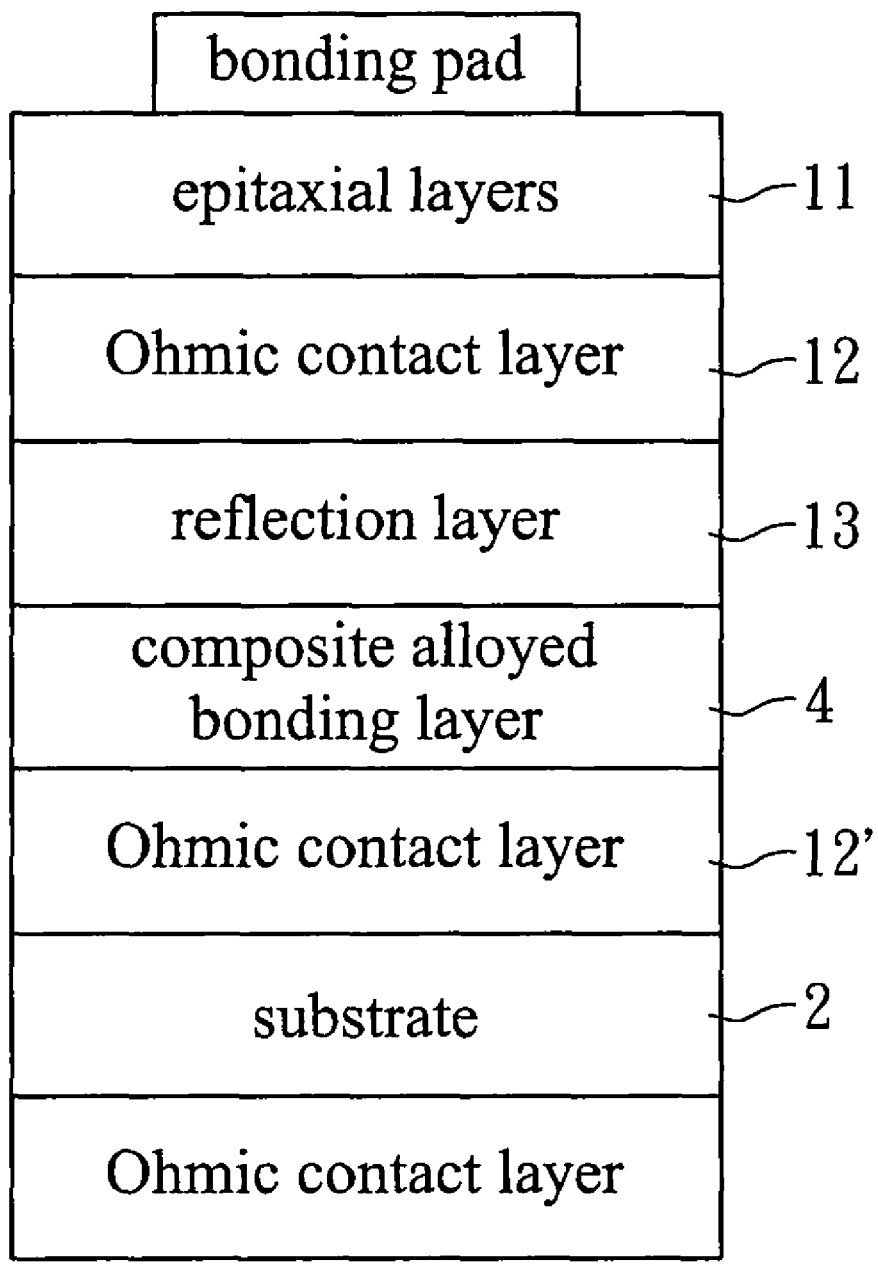
FIG. 8 is a schematic view showing a high efficiency photonic device that is formed after the pressurization shown in FIG. 7.

Moreover, as shown in FIGS. 6-8, another embodiment of the present invention is disclosed. In this embodiment, the semiconductor structure 1 further includes an Ohmic contact layer 12 that is provided on the epitaxial layers 11. The Ohmic contact layer 12 is further provided with a reflection layer 13 thereon. In addition, the substrate 2 also includes an Ohmic contact layer 12'. Thereby, when the composite bonding layer 3 is formed on the substrate 2, the composite bonding layer 3 can be bonded with part of the reflection layer 13 of the semiconductor structure 1 to form the composite alloyed bonding layer 4. By this way, the objects and the effects of the present invention also can be achieved. Finally, after the compound semiconductor substrate 10 is removed, the epitaxial layers 11 grown on the compound semiconductor substrate 10 can be transferred onto the substrate 2 to form a high efficiency photonic device 5'. Furthermore, above Ohmic contact layer 12 and the reflection layer 13 also can be directly replaced with a high-reflectance Ohmic contact layer.

Furthermore, according to the present invention, an outmost layer can be added on the composite bonding layer 3, where the outmost layer is made by gold, silver, or platinum, and the thickness thereof is less than 2000 Angstroms. Consequently, the oxidation degree of the composite bonding layer 3 can be further reduced. In addition, in order to prevent the epitaxial layers 11, substrate 2, or composite bonding layer 3 from being deformed and curved as a result of temperature change and thermal expansion coefficient difference, the surface thereof can be designed to be uneven.

Therefore, in the present invention, the composite bonding layer 3, which is used as a medium for bonding the semiconductor structure 1 and the substrate 2, is made by material having low melting point or low eutectic melting point, and the easily oxidized layer can be arranged in the inner part of the composite bonding layer. Accordingly, by using above composite bonding layer 3, the semiconductor structure 1 and the substrate 2 can be bonded rapidly with each other at low melting point and consequently the problems of oxidation and deformation can be solved or reduced. Moreover, the composite alloyed bonding layer 4 can be formed by the process of pressurization under lower ambient temperature (as lower as 60° C.) since the composite bonding layer 3 has low melting point. Consequently, not only can the oxidation degree of the bonding layer be effectively reduced, but the yield, the reliability of bonded semiconductor devices, and the heat dissipation capability of semiconductor devices also can be increased.

As disclosed in the above description and attached drawings, the present invention can provide a method for bonding a semiconductor structure with a substrate and a high efficiency photonic device manufactured by the same method. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. A method for bonding a semiconductor structure with a substrate, comprising steps of:
    a. providing a semiconductor structure and a substrate;
    b. forming a composite bonding layer on the semiconductor structure; and
    c. bonding the substrate with the composite bonding layer on the semiconductor structure to form a composite alloyed bonding layer.

2. The method for bonding a semiconductor structure with a substrate as claimed in claim 1, wherein the semiconductor structure includes a compound semiconductor substrate; the compound semiconductor substrate is provided with epitaxial layers thereon, the composite bonding layer is provided on the epitaxial layers, and the surface of the epitaxial layers are uneven.

3. The method for bonding a semiconductor structure with a substrate as claimed in claim 1, wherein the surface of the substrate is uneven.

4. The method for bonding a semiconductor structure with a substrate as claimed in claim 1, wherein the composite bonding layer is pressurized to form the composite alloyed bonding layer at the temperature between 60° C. to 500° C.; the composite bonding layer includes at least two layers, where the thickness of outer layer is less than 5000 Angstroms; the melting point of the composite bonding layer is between 30° C. to 500° C.

5. The method for bonding a semiconductor structure with a substrate as claimed in claim 1, wherein the composite bonding layer is made by material that contains gallium and is selected from the group including: indium-gallium, zinc-gallium, tin-gallium, gold-gallium, silver-gallium, platinum-gallium, bismuth-gallium, indium-gallium-tin, indium-gallium-indium, zinc-gallium-zinc, indium-gallium-silver, and indium-gallium-gold.

6. The method for bonding a semiconductor structure with a substrate as claimed in claim 1, wherein the composite bonding layer is made by material that contains bismuth and is selected from the group including: indium-bismuth, bismuth-gallium, indium-bismuth-indium, gold-bismuth-indium, silver-bismuth-indium, and indium-bismuth-tin.

7. The method for bonding a semiconductor structure with a substrate as claimed in claim 1, wherein the composite bonding layer is made by material that has eutectic property and is selected from the group including: indium-bismuth, indium-tin, indium-bismuth-tin, and tin-bismuth.

8. The method for bonding a semiconductor structure with a substrate as claimed in claim 2, further comprising a step of removing the compound semiconductor substrate after the composite alloyed bonding layer is formed.

9. A method for bonding a semiconductor structure with a substrate, comprising steps of:
   a. providing a semiconductor structure and a substrate;
   b. forming a composite bonding layer on the substrate; and
   c. bonding the semiconductor structure with the composite bonding layer on the semiconductor structure to form a composite alloyed bonding layer.

10. The method for bonding a semiconductor structure with a substrate as claimed in claim 9, wherein the semiconductor structure includes a compound semiconductor substrate; the compound semiconductor substrate is provided with epitaxial layers thereon, and the surface of the epitaxial layers are uneven.

11. The method for bonding a semiconductor structure with a substrate as claimed in claim 9, wherein the surface of the substrate is uneven.

12. The method for bonding a semiconductor structure with a substrate as claimed in claim 9, wherein the composite bonding layer is pressurized to form the composite alloyed bonding layer at the temperature between 60° C. to 500° C.; the composite bonding layer includes at least two layers, where the thickness of outer layer is less than 5000 Angstroms; the melting point of the composite bonding layer is between 30° C. to 500° C.

13. The method for bonding a semiconductor structure with a substrate as claimed in claim 9, wherein the composite bonding layer is made by material that contains gallium and is selected from the group including: indium-gallium, zinc-gallium, tin-gallium, gold-gallium, silver-gallium, platinum-gallium, bismuth-gallium, indium-gallium-tin, indium-gallium-indium, zinc-gallium-zinc, indium-gallium-silver, and indium-gallium-gold.

14. The method for bonding a semiconductor structure with a substrate as claimed in claim 9, wherein the composite bonding layer is made by material that contains bismuth and is selected from the group including: indium-bismuth, bismuth-gallium, indium-bismuth-indium, gold-bismuth-indium, silver-bismuth-indium, and indium-bismuth-tin.

15. The method for bonding a semiconductor structure with a substrate as claimed in claim 9, wherein the composite bonding layer is made by material that has eutectic property and is selected from the group including: indium-bismuth, indium-tin, indium-bismuth-tin, and tin-bismuth.

16. The method for bonding a semiconductor structure with a substrate as claimed in claim 10, further comprising a step of removing the compound semiconductor substrate after the composite alloyed bonding layer is formed.

17. A method for bonding a semiconductor structure with a substrate, comprising steps of:
   a. providing a semiconductor structure and a substrate;
   b. forming a composite bonding layer respectively on the semiconductor structure and the substrate; and
   c. bonding above two composite bonding layers to form a composite alloyed bonding layer.

18. The method for bonding a semiconductor structure with a substrate as claimed in claim 17, wherein the semiconductor structure includes a compound semiconductor substrate; the compound semiconductor substrate is provided with epitaxial layers thereon, one composite bonding layer is provided on the epitaxial layers, and the surface of the epitaxial layers are uneven.

19. The method for bonding a semiconductor structure with a substrate as claimed in claim 17, wherein the surface of the substrate is uneven.

20. The method for bonding a semiconductor structure with a substrate as claimed in claim 17, wherein the composite bonding layer is pressurized to form the composite alloyed bonding layer at the temperature between 60° C. to 500° C.; the composite bonding layer includes at least two layers, where the thickness of outer layer is less than 5000 Angstroms; the melting point of the composite bonding layer is between 30° C. to 500° C.

21. The method for bonding a semiconductor structure with a substrate as claimed in claim 17, wherein the composite bonding layer is made by material that contains gallium and is selected from the group including: indium-gallium, zinc-gallium, tin-gallium, gold-gallium, silver-gallium, platinum-gallium, bismuth-gallium, indium-gallium-tin, indium-gallium-indium, zinc-gallium-zinc, indium-gallium-silver, and indium-gallium-gold.

22. The method for bonding a semiconductor structure with a substrate as claimed in claim 17, wherein the composite bonding layer is made by material that contains bismuth and is selected from the group including: indium-bismuth, bismuth-gallium, indium-bismuth-indium, gold-bismuth-indium, silver-bismuth-indium, and indium-bismuth-tin.

23. The method for bonding a semiconductor structure with a substrate as claimed in claim 17, wherein the composite bonding layer is made by material that has eutectic property and is selected from the group including: indium-bismuth, indium-tin, indium-bismuth-tin, and tin-bismuth.

24. The method for bonding a semiconductor structure with a substrate as claimed in claim 18, further comprising a step of removing the compound semiconductor substrate after the composite alloyed bonding layer is formed.

25. A high efficiency photonic device, at least comprising:
   a plurality of epitaxial layers,
   a substrate, and
   a composite bonding layer provided on the substrate or on the epitaxial layers, which are melted and fused to form a composite alloyed bonding layer for bonding the epitaxial layers and the substrate.

26. The high efficiency photonic device as claimed in claim 25, wherein the epitaxial layers are further provided with a composite bonding layer; the substrate and the composite bonding layer are melted and fused to form a composite alloyed bonding layer for bonding the epitaxial layers and the substrate; the surface of the epitaxial layers are uneven.

27. The high efficiency photonic device as claimed in claim 25, wherein the epitaxial layers are provided with a high-reflectance Ohmic contact layer thereon.

28. The high efficiency photonic device as claimed in claim 25, wherein the surface of the substrate is uneven.

29. The high efficiency photonic device as claimed in claim 25, wherein the composite bonding layer includes at least two layers and the thickness of outer layer is less than 5000 Angstroms, and the melting point of the composite bonding layer is between 30 to 500° C.

30. The high efficiency photonic device as claimed in claim 25, wherein the composite bonding layer is made by material that contains gallium and is selected from the group including: indium-gallium, zinc-gallium, tin-gallium, gold-gallium, silver-gallium, platinum-gallium, bismuth-gallium, indium-gallium-tin, indium-gallium-indium, zinc-gallium-zinc, indium-gallium-silver, and indium-gallium-gold.

31. The high efficiency photonic device as claimed as claimed in claim 25, wherein the composite bonding layer is made by material that contains bismuth and is selected from the group including: indium-bismuth, bismuth-gallium, indium-bismuth-indium, gold-bismuth-indium, silver-bismuth-indium, and indium-bismuth-tin.

32. The high efficiency photonic device as claimed in claim 25, wherein the composite bonding layer is made by material that has eutectic property and is selected from the group including: indium-bismuth, indium-tin, indium-bismuth-tin, and tin-bismuth.

* * * * *